United States Patent
Nishijima et al.

(10) Patent No.: US 9,809,728 B2
(45) Date of Patent: Nov. 7, 2017

(54) ADHESIVE AGENT COMPOSITION, ADHESIVE SHEET, AND ELECTRONIC DEVICE AND PRODUCTION METHOD THEREFOR

(71) Applicant: LINTEC CORPORATION, Tokyo (JP)

(72) Inventors: Kenta Nishijima, Tokyo (JP); Satoshi Naganawa, Tokyo (JP); Emi Fuchi, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 0 days.

(21) Appl. No.: 14/648,579

(22) PCT Filed: Nov. 29, 2013

(86) PCT No.: PCT/JP2013/082173
§ 371 (c)(1),
(2) Date: May 29, 2015

(87) PCT Pub. No.: WO2014/084352
PCT Pub. Date: Jun. 5, 2014

(65) Prior Publication Data
US 2015/0299519 A1    Oct. 22, 2015

(30) Foreign Application Priority Data

Nov. 30, 2012  (JP) ................................ 2012-263876
Nov. 30, 2012  (JP) ................................ 2012-263877

(51) Int. Cl.
*C09J 7/02* (2006.01)
*C09J 123/22* (2006.01)
(Continued)

(52) U.S. Cl.
CPC ................ *C09J 7/02* (2013.01); *B32B 37/12* (2013.01); *B32B 37/182* (2013.01);
(Continued)

(58) Field of Classification Search
CPC combination set(s) only.
See application file for complete search history.

(56) References Cited

U.S. PATENT DOCUMENTS

2002/0140890 A1 * 10/2002 Hanada ................ G02F 1/1333
                                                                    349/122
2003/0148179 A1    8/2003 Uyama et al.
(Continued)

FOREIGN PATENT DOCUMENTS

EP    2 615 144 A1    7/2013
EP    2 727 972 A1    5/2014
(Continued)

OTHER PUBLICATIONS

International Search Report, issued in PCT/JP2013/082173, dated Mar. 4, 2014.

*Primary Examiner* — Kyoung Lee
*Assistant Examiner* — Ratisha Mehta
(74) *Attorney, Agent, or Firm* — Birch, Stewart, Kolasch & Birch, LLP

(57) ABSTRACT

The present invention provides: an adhesive composition for sealing an electronic device, the adhesive composition comprising an isobutylene-isoprene copolymer as a main component, the isobutylene-isoprene copolymer having a content of repeating units derived from isoprene of 0.1 to 99 mol % based on total repeating units; an adhesive sheet comprising a gas barrier film, and an adhesive layer that is formed on the gas barrier film, the gas barrier film having a water vapor transmission rate at a temperature of 40° C. and a relative humidity of 90% of 0.1 g/m$^2$/day or less, and
(Continued)

having a total light transmittance of 80% or more, and the adhesive layer comprising an adhesive composition that comprises an isobutylene-isoprene copolymer as a main component; and an electronic device or the like in which the adhesive composition and the adhesive sheet are used as a sealant for an organic electroluminescent element or the like. According to the present invention, provided are: an adhesive composition that is useful as a material for forming an adhesive layer that exhibits an excellent water barrier capability and excellent adhesion; an adhesive sheet; and an electronic device or the like.

1 Claim, 2 Drawing Sheets

(51) Int. Cl.
H05B 33/04 (2006.01)
H01L 51/52 (2006.01)
B32B 37/12 (2006.01)
B32B 37/18 (2006.01)
H01L 23/31 (2006.01)
H01L 21/56 (2006.01)
H01L 23/00 (2006.01)

(52) U.S. Cl.
CPC ............ C09J 7/0214 (2013.01); C09J 123/22 (2013.01); H01L 51/5246 (2013.01); H05B 33/04 (2013.01); B32B 2307/412 (2013.01); B32B 2457/206 (2013.01); C09J 2203/326 (2013.01); C09J 2205/114 (2013.01); C09J 2400/10 (2013.01); C09J 2409/00 (2013.01); C09J 2423/00 (2013.01); C09J 2467/005 (2013.01); C09J 2467/006 (2013.01); H01L 21/565 (2013.01); H01L 23/3121 (2013.01); H01L 23/564 (2013.01); H01L 2924/0002 (2013.01)

(56) References Cited

U.S. PATENT DOCUMENTS

| | | | |
|---|---|---|---|
| 2007/0299161 A1* | 12/2007 | McDonald | C08C 1/14 523/332 |
| 2009/0026934 A1 | 1/2009 | Fujita et al. | |
| 2010/0210772 A1* | 8/2010 | Hiwatashi | C09J 133/08 524/407 |
| 2011/0100415 A1* | 5/2011 | Osamura | B32B 25/08 136/244 |
| 2011/0105637 A1* | 5/2011 | Fujita | C08L 23/22 522/120 |
| 2011/0121356 A1* | 5/2011 | Krawinkel | C03C 27/10 257/100 |
| 2011/0247674 A1 | 10/2011 | Fujii et al. | |
| 2012/0031485 A1* | 2/2012 | Hoshi | B32B 27/06 136/256 |
| 2012/0200221 A1* | 8/2012 | Inoue | H01L 51/5271 313/504 |

FOREIGN PATENT DOCUMENTS

| | | |
|---|---|---|
| EP | 2 737 997 A1 | 6/2014 |
| JP | 5-101884 A | 4/1993 |
| JP | 5/182759 A | 7/1993 |
| JP | 2004-87153 A | 3/2004 |
| JP | 2004-224991 A | 8/2004 |
| JP | 2011-54743 A | 3/2011 |
| JP | 2011-526629 A | 10/2011 |
| JP | 2011-231309 A | 11/2011 |
| JP | 2012-57065 A | 3/2012 |
| WO | WO 01/95411 A1 | 12/2001 |
| WO | WO 2007/087281 A1 | 8/2007 |
| WO | WO 2007/111607 A1 | 10/2007 |

* cited by examiner (a)

(b)

(c)

US 9,809,728 B2

ADHESIVE AGENT COMPOSITION, ADHESIVE SHEET, AND ELECTRONIC DEVICE AND PRODUCTION METHOD THEREFOR

TECHNICAL FIELD

The present invention relates to an adhesive composition that is useful as a material for forming an adhesive layer that exhibits an excellent water barrier capability (water-blocking capability) and excellent adhesion, an adhesive sheet that includes an adhesive layer that is formed using the adhesive composition, an adhesive sheet that includes a gas barrier film, and an adhesive layer that is formed on the gas barrier film, an electronic device that includes a sealing material that is formed using the adhesive composition, an electronic device in which a photoelectric conversion device is sealed with the adhesive layer of the adhesive sheet, and a method for producing an electronic device.

BACKGROUND ART

In recent years, an organic EL device has attracted attention as a light-emitting device that can emit light with high luminance through low-voltage DC drive.

However, the organic EL device has a problem in that emission properties (e.g., luminance, luminous efficiency, and luminous uniformity) easily deteriorate with the passage of time.

It is considered that a deterioration in emission properties occurs when oxygen, water, and the like enter the organic EL device, and cause the electrode and the organic layer to deteriorate. Methods that utilize a sealing material have been proposed in order to solve this problem.

For example, Patent Document 1 discloses an organic EL device having a configuration in which a photocurable resin layer (sealing material) having humidity resistance covers an organic EL layer that is provided on a glass substrate and placed between a transparent electrode and a bottom electrode that are formed in the shape of a thin film. Patent Document 2 discloses a method that seals an organic EL device using a sealing film that is formed using a moisture-proof polymer film and an adhesive layer.

An acrylic-based adhesive and an acrylic-based pressure-sensitive adhesive (hereinafter referred to as "acrylic-based adhesive and the like") have been proposed as an adhesive and a pressure-sensitive adhesive that are used as the sealing material for the organic EL device, taking account of optical properties such as transparency.

For example, Patent Document 3 discloses a UV-curable acrylic-based adhesive that can be cured at room temperature as a sealing material for an organic EL display.

Patent Document 4 discloses an acrylic-based pressure-sensitive adhesive as a pressure-sensitive adhesive that can form a pressure-sensitive adhesive layer that allows light emitted from an organic EL display device to propagate to the surface of the display with an excellent propagation efficiency even after being heated.

However, a sealing material that is formed using the acrylic-based adhesive and the like has an insufficient water barrier capability, and is not satisfactory as to performance when used as a sealing material for which a very high water barrier capability is required (e.g., the sealing material for the organic EL device).

When a sealing material that is formed using the acrylic-based adhesive and the like has a crosslinked structure, the sealing material may be easily delaminated from the adherend due to an impact, vibrations, heat, or the like, and the water barrier capability may deteriorate to a large extent.

In recent years, an adhesive that includes a polyisobutylene-based resin has been proposed as a sealing adhesive that exhibits a good water barrier capability.

For example, Patent Document 5 discloses an adhesive composition that is used as a sealing material for an organic EL display, and includes a specific hydrogenated cycloolefin-based polymer and a polyisobutylene resin.

RELATED-ART DOCUMENT

Patent Document

Patent Document 1: JP-A-5-182759
Patent Document 2: JP-A-5-101884
Patent Document 3: JP-A-2004-87153
Patent Document 4: JP-A-2004-224991
Patent Document 5: JP-T-2009-524705 (WO2007/0087281)

SUMMARY OF THE INVENTION

Technical Problem

A sealing material obtained using the adhesive composition disclosed in Patent Document 5 that includes a polyisobutylene-based resin exhibits a good water barrier capability as compared with a sealing material obtained using an acrylic-based adhesive. However, the water barrier capability of the sealing material obtained using the adhesive composition disclosed in Patent Document 5 is insufficient when it is used as a sealing material for the organic EL device. It is particularly important to prevent entry of water from the interface or the side of the sealing material when a very high water barrier capability is required (e.g., organic EL device). However, the sealing material obtained using the adhesion composition disclosed in Patent Document 5 is not satisfactory as to such performance. Moreover, Patent Document 5 is silent about the characteristics of a film that is stacked on the sealing material.

The invention was conceived in view of the above situation. An object of the invention is to provide (i) an adhesive composition that is useful as a material for forming an adhesive layer that exhibits an excellent water barrier capability and excellent adhesion, (ii) an adhesive sheet (A) that includes an adhesive layer that is formed using the adhesive composition, (iii) an adhesive sheet (B) that includes a gas barrier film that exhibits an excellent gas barrier capability and excellent transparency, and an adhesive layer that is formed on the gas barrier film, and that exhibits an excellent water barrier capability, excellent transparency, and excellent adhesion, (iv) an electronic device that includes a sealing material that is formed using the adhesive composition, (v) an electronic device in which a device (e.g., organic EL device) is sealed with the adhesive layer of the adhesive sheet (B), and a method for producing the same.

Solution to Problem

The inventors of the invention conducted extensive studies in order to achieve the above object. As a result, the inventors found that an adhesive composition that includes an isobutylene-isoprene copolymer as the main component exhibits an excellent water barrier capability and excellent adhesion, and is suitable as a sealing material for a photoelectric conversion device or the like that is formed on a transparent substrate, and an adhesive sheet that includes a gas barrier film that exhibits a specific gas barrier capability and transparency, and an adhesive layer that is formed on the gas barrier film using an adhesive composition that includes an isobutylene-isoprene copolymer as the main component, exhibits an excellent water barrier capability, excellent transparency, and excellent adhesion, and is suitable as a sealing material for a photoelectric conversion device formed on a transparent substrate. This finding has led to the completion of the invention.

Several aspects of the invention provide the following adhesive composition (see (1) to (3)), adhesive sheet (see (4) to (11)), electronic device (see (12) to (14)), and method for producing an electronic device (see (15)).

(1) An adhesive composition for sealing an electronic device, the adhesive composition including an isobutylene-isoprene copolymer as the main component, the isobutylene-isoprene copolymer having a content of repeating units derived from isoprene of 0.1 to 99 mol % based on the total repeating units.

(2) The adhesive composition according to (1), further including a tackifier in an amount of 5 to 100 parts by mass based on 100 parts by mass of the isobutylene-isoprene copolymer.

(3) The adhesive composition according to (2), wherein the tackifier is an aliphatic petroleum resin.

(4) An adhesive sheet including a release sheet, and an adhesive layer that is formed on the release sheet, the adhesive layer being formed using the adhesive composition according to any one of (1) to (3).

(5) An adhesive sheet including a gas barrier film, and an adhesive layer that is formed on the gas barrier film, the gas barrier film having a water vapor transmission rate at a temperature of 40° C. and a relative humidity of 90% of 0.1 $g/m^2/day$ or less, and having a total light transmittance of 80% or more, and the adhesive layer including an adhesive composition that includes an isobutylene-isoprene copolymer as the main component.

(6) The adhesive sheet according to (5), wherein the isobutylene-isoprene copolymer has a content of repeating units derived from isoprene of 0.1 to 99 mol % based on the total repeating units.

(7) The adhesive sheet according to (4) or (5), wherein the adhesive layer has a water vapor transmission rate at a temperature of 40° C. and a relative humidity of 90% of 10 $g/m^2/day$ or less when the adhesive layer has a thickness of 60 μm.

(8) The adhesive sheet according to (4) or (5), wherein the adhesive layer further includes a tackifier in an amount of 5 to 100 parts by mass based on 100 parts by mass of the isobutylene-isoprene copolymer.

(9) The adhesive sheet according to (4) or (5), wherein the adhesive layer has a storage modulus at 20 to 60° C. of $10^5$ to $10^6$ Pa.

(10) The adhesive sheet according to (4) or (5), wherein the adhesive layer has an adhesion to a glass substrate of 3 N/25 mm or more.

(11) The adhesive sheet according to (4) or (5), wherein a product of a water vapor transmission rate X ($g/m^2/day$) of the adhesive layer at a temperature of 40° C. and a relative humidity of 90%, and a thickness Y (μm) of the adhesive layer, is less than 300.

(12) An electronic device including a transparent substrate, a device that is formed on the transparent substrate, and a sealing material that seals the device, the sealing material including the adhesive composition according to any one of (1) to (3).

(13) An electronic device including a transparent substrate, a device that is formed on the transparent substrate, and a sealing material that seals the device, the sealing material being formed using the adhesive sheet according to any one of (4) to (11).

(14) An electronic device including a transparent substrate, a device that is formed on the transparent substrate, and an adhesive sheet that is stacked so as to cover the device, the adhesive sheet including a gas barrier film, and an adhesive layer that is formed on the gas barrier film, the adhesive layer including a composition that includes an isobutylene-isoprene copolymer as the main component, the gas barrier film having a water vapor transmission rate at a temperature of 40° C. and a relative humidity of 90% of 0.1 $g/m^2/day$ or less, and having a total light transmittance of 80% or more, and the device being sealed with the adhesive layer.

(15) A method for producing an electronic device that includes a transparent substrate, a device that is formed on the transparent substrate, and an adhesive sheet that is stacked so as to cover the device, the method including stacking the adhesive sheet according to any one of (4) to (11) so as to cover the device that is formed on the transparent substrate.

Advantageous Effects of the Invention

The aspects of the invention thus provide an adhesive composition that is useful for forming an adhesive layer that exhibits an excellent water barrier capability and excellent adhesion, an adhesive sheet that includes an adhesive layer that is formed using the adhesive composition, an electronic device that includes a sealing material that is formed using the adhesive composition, and a method for producing the same.

DESCRIPTION OF EMBODIMENTS

Figure 1:
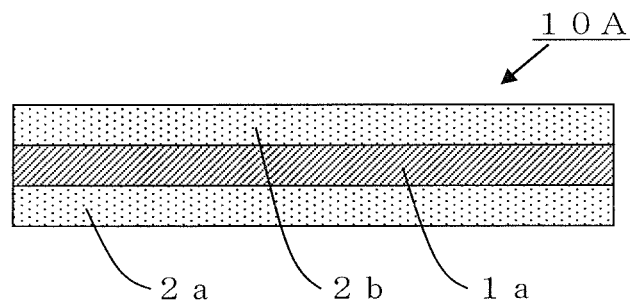
FIG. 1 is a view illustrating an example of the layer configuration of an adhesive sheet according to one embodiment of the invention.

An adhesive composition, an adhesive sheet, an electronic device, and a method for producing the same according to several exemplary embodiments of the invention are described in detail below.

1) Adhesive Composition

An adhesive composition (hereinafter may be referred to as "adhesive composition (A)") according to one embodiment of the invention is an adhesive composition for sealing an electronic device, the adhesive composition including an isobutylene-isoprene copolymer as the main component, the isobutylene-isoprene copolymer having a content of repeating units derived from isoprene of 0.1 to 99 mol % based on the total repeating units.

The expression "the adhesive composition including an isobutylene-isoprene copolymer as the main component"

used herein means that the content (on a solid basis) of the isobutylene-isoprene copolymer in the adhesive composition is 50 mass % or more.

Since the adhesive composition (A) includes the isobutylene-isoprene copolymer as the main component, and the isobutylene-isoprene copolymer includes repeating units derived from isoprene as a polymer component, and has a content of repeating units derived from isoprene within the above range, the adhesive composition (A) exhibits an excellent water barrier capability and excellent adhesion. Therefore, the adhesive composition (A) may suitably be used as a sealing material for an electronic device that can prevent a situation in which oxygen, water, and the like enter an electronic device, and cause an electrode and an organic layer to deteriorate.

The isobutylene-isoprene copolymer used as the component of the adhesive composition (A) is described below.

The term "isobutylene-isoprene copolymer" used herein refers to a synthetic rubber that includes a repeating unit ($-CH_2-CH(CH_3)_2-$) derived from isobutylene and a repeating unit ($-CH_2-C(CH_3)=CH-CH_2-$) derived from isoprene in the molecule. The isobutylene-isoprene copolymer normally has a content of repeating units derived from isoprene of 0.1 to 99 mol %, preferably 0.5 to 50 mol %, and more preferably 1 to 10 mol %, based on the total repeating units.

When the content of repeating units derived from isoprene in the copolymer is within the above range, it is possible to obtain an adhesive composition that exhibits an excellent water barrier capability. The reason therefor is not clear at present. It is conjectured that a stacking effect due to the double bonds included in the skeleton derived from isoprene contributes to the above advantageous effect.

The isobutylene-isoprene copolymer may be obtained by subjecting isobutylene and a small amount of isoprene to cationic copolymerization at a low temperature using aluminum chloride as a catalyst, for example.

The isobutylene-isoprene copolymer may have been copolymerized with an additional rubber component as long as the advantageous effects of the invention are not impaired.

The type of the isobutylene-isoprene copolymer is not particularly limited. For example, the isobutylene-isoprene copolymer may be a recycled isobutylene-isoprene copolymer, a synthetic isobutylene-isoprene copolymer, or the like. It is preferable to use a synthetic isobutylene-isoprene copolymer.

These isobutylene-isoprene copolymers may be used either alone or in combination.

The number average molecular weight of the isobutylene-isoprene copolymer is normally 100,000 to 5,000,000, preferably 150,000 to 2,000,000, and more preferably 200,000 to 1,000,000.

When the adhesive composition (A) is prepared using an isobutylene-isoprene copolymer having a number average molecular weight within the above range, the adhesive composition (A) exhibits moderate fluidity and sufficient adhesion. Moreover, since the isobutylene-isoprene copolymer is easily dissolved in a normal organic solvent, it is possible to efficiently prepare the adhesive composition (A).

Note that the number average molecular weight of the isobutylene-isoprene copolymer may be determined by gel permeation chromatography as a standard polystyrene-reduced value (standard polystyrene-equivalent value).

The Mooney viscosity of the isobutylene-isoprene copolymer is preferably 30 to 60 (ML1+4, 100° C.), and more preferably 35 to 55 (ML1+4, 100° C.).

When the Mooney viscosity of the isobutylene-isoprene copolymer is within the above range, the isobutylene-isoprene copolymer is easily dissolved in a normal organic solvent, and it is possible to efficiently prepare the adhesive composition (A).

The content (on a solid basis) of the isobutylene-isoprene copolymer in the adhesive composition is preferably 50 to 90 mass %, and more preferably 60 to 80 mass %.

When the content of the isobutylene-isoprene copolymer in the adhesive composition is within the above range, it is possible to obtain an adhesive composition (A) that is useful for forming an adhesive layer that exhibits an excellent water barrier capability and excellent adhesion.

The adhesive composition (A) may include an additional rubber-based polymer component as long as the advantageous effects of the invention are not impaired.

Examples of the additional rubber-based polymer component include natural rubber (NR), an isobutylene homopolymer (polyisobutylene (IM)), a copolymer of isobutylene and n-butene, a butadiene homopolymer (butadiene rubber (BR)), a chloroprene homopolymer (chloroprene rubber (CR)), an isoprene homopolymer (isoprene rubber (IR)), a copolymer of isobutylene and butadiene, a copolymer of isobutylene and isoprene (butyl rubber (IIR)), a halogenated butyl rubber, a copolymer of styrene and 1,3-butadiene (styrene-butadiene rubber (SBR)), a copolymer of acrylonitrile and 1,3-butadiene (nitrile rubber), a styrene-1,3-butadiene-styrene block copolymer (SBS), a styrene-isoprene-styrene block copolymer (SIS), an ethylene-propylene-nonconjugated diene ternary copolymer, and the like.

It is preferable that the adhesive composition (A) include a tackifier in addition to the isobutylene-isoprene copolymer.

When the adhesive composition (A) includes the tackifier, it is possible to obtain an adhesive composition (A) that is useful for forming an adhesive layer that exhibits a further improved water barrier capability and further improved adhesion.

The tackifier is not particularly limited as long as the tackifier improves the adhesion of the adhesive layer. A known material may be used as the tackifier. Examples of the tackifier include an alicyclic petroleum resin, an aliphatic petroleum resin, a terpene resin, an ester-based resin, a coumarone-indene resin, a rosin-based resin, an epoxy resin, a phenol resin, an acrylic resin, a butyral resin, an olefin resin, a chlorinated olefin resin, a vinyl acetate resin, modified resins or hydrogenated resins thereof, and the like. Among these, an aliphatic petroleum resin, a terpene resin, a rosin ester-based resin, a rosin-based resin, and the like are preferable.

It is preferable to use a hydrogenated resin as the tackifier since an adhesive layer that is rarely discolored even at a high temperature and a high humidity can be formed. The hydrogenated resin may be a partially hydrogenated product, or may be a completely hydrogenated product.

The weight average molecular weight of the tackifier is preferably 100 to 10,000, and more preferably 500 to 5000.

The softening point of the tackifier is preferably 50 to 160° C., more preferably 60 to 140° C., and still more preferably 70 to 130° C.

A commercially available product may be used directly as the tackifier. Examples of a commercially available product that may be used as the tackifier include an aliphatic petroleum resin such as an ESCOREZ 1000 series (manufactured by Exxon Chemical Co., Ltd.), and a Quintone A/B/R/CX series (manufactured by Zeon Corporation); an alicyclic petroleum resin such as an Arkon P/M series (manufactured by Arakawa Chemical Industries, Ltd.), an ESCOREZ series (manufactured by Exxon Chemical Co., Ltd.), an EASTOTAC series (manufactured by Eastman Chemical Company), and an IMARV series (manufactured by Idemitsu Kosan Co., Ltd.); a terpene-based resin such as a YS resin P/A series (manufactured by Yasuhara Chemical Co., Ltd.), a Clearon P series (manufactured by Yasuhara Chemical Co., Ltd.), and a Piccolyte A/C series (manufactured by Hercules); an ester-based resin such as a Foral series (manufactured by Hercules), a Pensel A series (manufactured by Arakawa Chemical Industries, Ltd.), an Ester Gum series (manufactured by Arakawa Chemical Industries, Ltd.), a Super Ester series (manufactured by Arakawa Chemical Industries, Ltd.), and a Pinecrystal series (manufactured by Arakawa Chemical Industries, Ltd.); and the like.

When the adhesive composition (A) includes the tackifier, the tackifier is normally used in an amount of 5 to 100 parts by mass, and preferably 10 to 70 parts by mass, based on 100 parts by mass of the isobutylene-isoprene copolymer.

When the tackifier is used in an amount of 5 parts by mass or more based on 100 parts by mass of the isobutylene-isoprene copolymer, it is possible to efficiently form an adhesive layer that exhibits further improved adhesion. When the tackifier is used in an amount of 70 parts by mass or less based on 100 parts by mass of the isobutylene-isoprene copolymer, it is possible to prevent a situation in which the cohesive strength of the adhesive layer decreases.

The adhesive composition (A) may include an additional component as long as the advantageous effects of the invention are not impaired.

Examples of the additional component include additives such as a silane coupling agent, an antistatic agent, a light stabilizer, an antioxidant, a UV absorber, a resin stabilizer, a filler, a pigment, an extender, and a softener.

These additives may be used either alone or in combination.

The content of each additional component in the adhesive composition (A) is preferably 0.01 to 5 mass %, and more preferably 0.01 to 2 mass %.

The adhesive composition (A) may be prepared by appropriately mixing and stirring the isobutylene-isoprene copolymer, the tackifier (optional), an optional additional component, and a solvent using a normal method.

Examples of the solvent include an aromatic hydrocarbon-based solvent such as benzene and toluene; an ester-based solvent such as ethyl acetate and butyl acetate; a ketone-based solvent such as acetone, methyl ethyl ketone, and methyl isobutyl ketone; an aliphatic hydrocarbon-based solvent such as n-pentane, n-hexane, and n-heptane; an alicyclic hydrocarbon-based solvent such as cyclopentane and cyclohexane; and the like.

These solvents may be used either alone or in combination.

The solid content in the adhesive composition (A) is preferably 10 to 60 mass %, more preferably 10 to 45 mass %, and still more preferably 15 to 30 mass %.

An adhesive layer that exhibits an excellent water vapor barrier capability and excellent adhesion can be formed using the adhesive composition (A).

An adhesive layer having a thickness of 60 μm that is formed using the adhesive composition (A) preferably has a water vapor transmission rate at a temperature of 40° C. and a relative humidity of 90% of 10 g/m$^2$/day or less, more preferably 8 g/m$^2$/day or less, and still more preferably 5 g/m$^2$/day or less.

The water vapor transmission rate of the adhesive layer may be measured using the method described later in connection with the examples.

When an adhesive layer having a thickness of 60 μm that is formed using the adhesive composition (A) has a water vapor transmission rate within the above range, the adhesive layer can more effectively suppress entry of water vapor when used as a sealing material for an electronic device.

Since the water vapor transmission rate of the adhesive layer depends on the thickness of the adhesive layer, the water vapor transmission rate of the adhesive layer is converted using the thickness of the adhesive layer when the thickness of the adhesive layer is not 60 μm. For example, when the thickness of the adhesive layer is A μm, and the water vapor transmission rate of the adhesive layer is B g/m$^2$/day, the water vapor transmission rate of the adhesive layer is converted using the expression "A×B/60".

An adhesive layer that is formed using the adhesive composition according to one embodiment of the invention preferably has a storage modulus at 20 to 60° C. of $10^5$ to $10^6$ Pa.

When the storage modulus of the adhesive layer is within the above range, the adhesive layer sufficiently adheres to a device formed on a transparent substrate, for example, and can more effectively suppress entry of water vapor.

The storage modulus of the adhesive layer may be measured using a known dynamic viscoelastometer.

An adhesive layer that exhibits excellent adhesion can be formed using the adhesive composition (A). When an adhesive layer is formed using the adhesive composition (A), the product of the water vapor transmission rate X (g/m$^2$/day) of the adhesive layer at a temperature of 40° C. and a relative humidity of 90%, and the thickness Y (μm) of the adhesive layer, is preferably less than 300, more preferably 10 to 300, and still more preferably 100 to 200.

When the product of the water vapor transmission rate X and the thickness Y of the adhesive layer is within the above specific range, it is possible to effectively suppress entry of water vapor from the side of the adhesive layer when a device formed on a transparent substrate is sealed using the adhesive composition to obtain the electronic device illustrated in FIG. 2 (described later), for example.

If the product of the water vapor transmission rate X and the thickness Y of the adhesive layer exceeds 300, water vapor may enter in the thickness direction (side) of the adhesive layer, and a deterioration in a photoelectric conversion device may occur. If the product of the water vapor transmission rate X and the thickness Y of the adhesive layer is too small, sufficient adhesion may not be obtained, and a deterioration in water vapor barrier capability may occur.

Whether or not an adhesive layer that is formed using the adhesive composition (A) exhibits excellent adhesion is determined by measuring the adhesion of the adhesive layer.

An adhesive layer that is formed using the adhesive composition (A) preferably has an adhesion to a glass substrate of 1 N/25 mm or more, more preferably 2 N/25 mm or more, still more preferably 3 N/25 mm or more, particularly preferably 5 N/25 mm or more, and most preferably 10 N/25 mm or more.

When the adhesion of the adhesive layer is within the above range, the adhesive layer sufficiently adheres to a transparent substrate, and can more effectively suppress entry of water vapor.

The adhesion of the adhesive layer may be measured using the method described later in connection with the examples.

The adhesive composition (A) is also useful as a sealing material for a device formed on a transparent substrate, and a raw material for producing an adhesive sheet according to one embodiment of the invention (described later).

2) Adhesive Sheet

An adhesive sheet according to one embodiment of the invention is used as a sealing material for an electronic device, and includes a release sheet, and an adhesive layer that is formed on the release sheet (adhesive sheet (A)), or includes a gas barrier film, and an adhesive layer that is formed on the gas barrier film (adhesive sheet (B)).

The adhesive layer included in the adhesive sheet according to one embodiment of the invention is formed using the adhesive composition according to one embodiment of the invention.

Adhesive Sheet (A)

The layer configuration of the adhesive sheet (A) according to one embodiment of the invention is not particularly limited as long as the adhesive sheet (A) includes the release sheet, and the adhesive layer that is formed on the release sheet. For example, the adhesive sheet (A) may have a layer configuration in which an adhesive layer is provided between two release sheets so that the adhesive layer comes in contact with the release-treated surface of each release sheet, or may have a layer configuration in which a plurality of layer structural units are stacked, each of the plurality of layer structural units including a release sheet, and an adhesive layer that is formed on the release sheet.

FIG. 1 illustrates an example of the adhesive sheet (A). The adhesive sheet 10A illustrated in FIG. 1 includes a release sheet 2a (first release sheet), a release sheet 2b (second release sheet), and an adhesive layer 1a that is provided between the release sheet 2a and the release sheet 2b so that the adhesive layer comes in contact with the release-treated surface of each of the release sheet 2a and the release sheet 2b. The adhesive layer 1a is formed using the adhesive composition (A) according to one embodiment of the invention.

Since the adhesive layer included in the adhesive sheet (A) is formed using the adhesive composition (A), the adhesive layer exhibits sufficient cohesive strength, a further improved water barrier capability, and further improved adhesion.

The release sheet included in the adhesive sheet 10A is not particularly limited. For example, the release sheet may be a release sheet that includes a base, and a release layer that is provided on the base and subjected to a release treatment using a release agent. When the adhesive sheet according to one embodiment of the invention includes two or more release sheets, the two or more release sheets may be formed of either an identical material or different materials.

Examples of the base used to produce the release sheet include a paper base such as glassine paper, coated paper, and high-quality paper; laminated paper obtained by laminating a thermoplastic resin (e.g., polyethylene) on such a paper base; a plastic film formed of a polyethylene terephthalate resin, a polybutyrene terephthalate resin, a polyethylene naphthalate resin, a polypropylene resin, a polyethylene resin, or the like; and the like.

Examples of the release agent include a silicone-based resin, an olefin-based resin, a rubber-based elastomer (e.g., isoprene-based resin and butadiene-based resin), a long-chain alkyl-based resin, an alkyd-based resin, a fluorine-based resin, and the like.

The release sheet may be a double-sided release sheet in which the release layer is formed on each side of the base, or may be a single-sided release sheet in which the release layer is formed on one side of the base.

The thickness of the release sheet is not particularly limited, but is normally 20 to 200 μm, and preferably 25 to 150 μm.

The adhesive layer may be formed using an arbitrary method. For example, the adhesive layer may be formed by applying the adhesive composition (A) to the release-treated surface of the release sheet, or a sealing substrate, using a known method, and drying the resulting film.

The adhesive composition (A) may be applied using a spin coating method, a spray coating method, a bar coating method, a knife coating method, a roll coating method, a blade coating method, a die coating method, a gravure coating method, or the like.

The film is dried at 80 to 150° C. for 30 seconds to 5 minutes, for example.

The thickness of the adhesive layer is not particularly limited, and may be appropriately determined taking account of the application. The thickness of the adhesive layer is preferably 0.5 to 200 μm, more preferably 1 to 100 μm, and still more preferably 5 to 80 μm. When the thickness of the adhesive layer is 0.5 μm or more, further improved adhesion can be easily obtained. When the thickness of the adhesive layer is 100 μm or less, it is possible to form the adhesive layer with high productivity.

After forming the adhesive layer, the second release sheet is bonded to the adhesive layer so that the second release sheet is opposite to the release layer of the first release sheet through the adhesive layer to obtain the desired adhesive sheet (A).

The adhesive layer included in the adhesive sheet (A) thus obtained exhibits an excellent water barrier capability and excellent adhesion. Therefore, when the adhesive layer is used as a sealing material, it is possible to sufficiently prevent entry of water. Since the sealing material is not easily separated (delaminated) at the bonding interface even when heat or vibrations occur when the device is driven, it is possible to prevent entry of water and the like for a long time.

Therefore, the adhesive sheet (A) may preferably be used to form a sealing material for an electronic device (described later).

The adhesive sheet (A) is used as a sealing material for a device that can prevent a situation in which oxygen, water, and the like enter a device (e.g., organic EL device) formed on a transparent substrate, and cause an electrode and an organic layer to deteriorate.

Adhesive Sheet (B)

The adhesive sheet (B) according to one embodiment of the invention is used as a sealing material for an electronic device, and includes the gas barrier film, and the adhesive layer that is formed on the gas barrier film.

(1) Gas Barrier Film

The gas barrier film included in the adhesive sheet (B) has a water vapor transmission rate at a temperature of 40° C. and a relative humidity of 90% (hereinafter may be referred to as "90% RH") of 0.1 $g/m^2/day$ or less, preferably 0.05 $g/m^2/day$ or less, and more preferably 0.005 $g/m^2/day$ or less.

When the gas barrier film has a water vapor transmission rate at 40° C. and 90% RH of 0.1 $g/m^2/day$ or less, it is possible to effectively suppress a situation in which oxygen, water, and the like enter a device (e.g., organic EL device) formed on a transparent substrate, and cause an electrode and an organic layer to deteriorate.

The water vapor transmission rate of the gas barrier film may be measured using a known gas transmission rate measurement apparatus.

The gas barrier film included in the adhesive sheet (B) has a total light transmittance of 80% or more, and preferably 85% or more.

When the gas barrier film has a total light transmittance of 80% or more, light incident on the device, or light emitted from the device is rarely blocked. Therefore, the adhesive sheet according to one embodiment of the invention can be used as a sealing material for a device formed on a transparent substrate, for which transparency is required.

The total light transmittance of the gas barrier film may be measured using the method described later in connection with the examples.

The gas barrier film is not particularly limited as long as the gas barrier film has a water vapor transmission rate at 40° C. and 90% RH of 0.1 $g/m^2/day$ or less, and has a total light transmittance of 80% or more. A known gas barrier film (e.g., a laminate film in which a gas barrier layer is formed on a base film either directly or through an additional layer) may be used as the gas barrier film.

A film formed of a resin (e.g., polyimide, polyamide, polyamide-imide, polyphenylene ether, polyether ketone, polyether ether ketone, polyolefin, polyester, polycarbonate, polysulfone, polyether sulfone, polyphenylene sulfide, polyarylate, acrylic-based resin, cycloolefin-based polymer, aromatic-based polymer, or polyurethane-based polymer) may be used as the base film.

The thickness of the base film is not particularly limited, but is preferably 0.5 to 500 μm, more preferably 1 to 200 μm, and still more preferably 5 to 100 μm, from the viewpoint of ease of handling.

A material for forming the gas barrier layer and the like are not particularly limited as long as it is possible to provide the gas barrier layer with the desired gas barrier capability. Examples of the gas barrier layer include an inorganic film, a gas barrier layer obtained by implanting ions into a layer that includes a polymer compound, and the like.

It is preferable that the gas barrier layer be a gas barrier layer that is formed of an inorganic film, or a gas barrier layer obtained by implanting ions into a layer that includes a polymer compound, since it is possible to efficiently form a thin layer that exhibits an excellent gas barrier capability.

The inorganic film is not particularly limited. Examples of the inorganic film include an inorganic deposited film.

Examples of the inorganic deposited film include a film obtained by depositing an inorganic compound, and a film obtained by depositing a metal.

Examples of the inorganic compound used as the raw material for forming the inorganic deposited film include an inorganic oxide such as silicon oxide, aluminum oxide, magnesium oxide, zinc oxide, indium oxide, and tin oxide; an inorganic nitride such as silicon nitride, aluminum nitride, and titanium nitride; an inorganic carbide; an inorganic sulfide; an inorganic oxynitride such as silicon oxynitride; an inorganic oxycarbide; an inorganic carbonitride; an inorganic oxycarbonitride; and the like.

Examples of the metal used as the raw material for forming the inorganic deposited film include aluminum, magnesium, zinc, tin, and the like.

Examples of a polymer compound that is used when forming the gas barrier layer by implanting ions into a layer that includes a polymer compound (hereinafter may be referred to as "polymer layer") include a silicon-containing polymer compound (e.g., polyorganosiloxane and polysilazane-based compound), a polyimide, a polyamide, a polyamide-imide, a polyphenylene ether, a polyether ketone, a polyether ether ketone, a polyolefin, a polyester, a polycarbonate, a polysulfone, a polyether sulfone, a polyphenylene sulfide, a polyallylate, an acrylic-based resin, a cycloolefin-based polymer, an aromatic polymer, and the like. These polymer compounds may be used either alone or in combination.

Among these, a silicon-containing polymer compound is preferable, and a polysilazane-based compound is more preferable, since a gas barrier layer that exhibits an excellent gas barrier capability can be formed.

A product commercially available as a glass coating material or the like may be used directly as the polysilazane-based compound.

The polysilazane-based compounds may be used either alone or in combination.

The polymer layer may include an additional component other than the polymer compound as long as the object of the invention is not impaired. Examples of the additional component include a curing agent, an additional polymer, an aging preventive, a light stabilizer, a flame retardant, and the like.

The polymer layer may be formed by applying a layer-forming solution that includes at least one polymer compound, an optional additional component, a solvent, and the like using a known device (e.g., spin coater, knife coater, or gravure coater), and appropriately drying the resulting film, for example.

Examples of the ions that are implanted into the polymer layer include ions of a rare gas such as argon, helium, neon, krypton, and xenon; ions of a fluorocarbon, hydrogen, nitrogen, oxygen, carbon dioxide, chlorine, fluorine, sulfur, and the like; ions of an alkane-based gas such as methane and ethane; ions of an alkene-based gas such as ethylene and propylene; ions of an alkadiene-based gas such as pentadiene and butadiene; ions of an alkyne-based gas such as acetylene; ions of an aromatic hydrocarbon-based gas such as benzene and toluene; ions of a cycloalkane-based gas such as cyclopropane; ions of a cycloalkene-based gas such as cyclopentene; ions of a metal; ions of an organosilicon compound; and the like.

These ions may be used either alone or in combination.

It is preferable to use ions of a rare gas such as argon, helium, neon, krypton, or xenon due to ease of ion implantation and a capability to form a gas barrier layer that exhibits a particularly excellent gas barrier capability.

The ions may be implanted using an arbitrary method. For example, the ions may be implanted by applying ions (ion beams) accelerated using an electric field, implanting ions present in plasma (plasma ion implantation method), or the like. It is preferable to use the plasma ion implantation method since a gas barrier film can be easily obtained.

The gas barrier film may further include an additional layer such as a protective layer, a conductive layer, or a primer layer. The additional layer may be situated (stacked) at an arbitrary position.

The thickness of the gas barrier film is not particularly limited, but is normally 10 to 2000 nm, preferably 20 to 1000 nm, more preferably 30 to 500 nm, and still more preferably 40 to 200 nm, from the viewpoint of gas barrier capability and handling capability.

The gas barrier layer may include a single layer, or may include a plurality of layers.

(2) Adhesive Layer

The adhesive sheet (B) includes the adhesive layer that is formed on the gas barrier film using an adhesive composition that includes an isobutylene-isoprene copolymer as the main component (hereinafter may be referred to as "adhesive composition (B)").

The expression "an adhesive composition that includes an isobutylene-isoprene copolymer as the main component" used herein means that the content (on a solid basis) of the isobutylene-isoprene copolymer in the adhesive composition is 50 mass % or more.

When the content of the isobutylene-isoprene copolymer in the adhesive composition is within the above range, it is possible to obtain an adhesive composition that is useful for forming an adhesive layer that exhibits an excellent water barrier capability, excellent transparency, and excellent adhesion. Specifically, when the adhesive layer is used as a sealing material for a device formed on a transparent substrate, it is possible to sufficiently prevent entry of water, and suppress a situation in which light incident on a photoelectric conversion device, or light emitted from a photoelectric conversion device, is blocked. Since the sealing material is not easily separated (delaminated) at the bonding interface, it is possible to prevent entry of water and the like for a long time.

An isobutylene-isoprene copolymer similar to the isobutylene-isoprene copolymer that is used as the main component of the adhesive composition (A) may be used as the isobutylene-isoprene copolymer.

The content (on a solid basis) of the isobutylene-isoprene copolymer in the adhesive composition is preferably 50 to 90 mass %, and more preferably 60 to 80 mass %.

When the content of the isobutylene-isoprene copolymer in the adhesive composition is within the above range, it is possible to obtain an adhesive composition (B) that is useful for forming an adhesive layer that exhibits an excellent water barrier capability and excellent adhesion.

The adhesive composition (B) according to one embodiment of the invention may include an additional rubber-based polymer component as long as the advantageous effects of the invention are not impaired.

A rubber-based polymer component similar to the rubber-based polymer component that may be used as the component of the adhesive composition (A) may be used as the additional rubber-based polymer component.

It is preferable that the adhesive composition (B) include a tackifier in addition to the isobutylene-isoprene copolymer.

When the adhesive composition (B) includes the tackifier, it is possible to obtain an adhesive composition that is useful for forming an adhesive layer that exhibits a further improved water barrier capability, transparency, and adhesion.

A tackifier similar to the tackifier that may be included in the adhesive composition (A) may be used as the tackifier.

When the adhesive composition (B) includes the tackifier, the tackifier is normally used in an amount of 5 to 100 parts by mass, and preferably 10 to 70 parts by mass, based on 100 parts by mass of the isobutylene-isoprene copolymer.

When the tackifier is used in an amount of 5 parts by mass or more based on 100 parts by mass of the isobutylene-isoprene copolymer, it is possible to efficiently form an adhesive layer that exhibits further improved adhesion. When the tackifier is used in an amount of 70 parts by mass or less based on 100 parts by mass of the isobutylene-isoprene copolymer, it is possible to prevent a situation in which the cohesive strength of the adhesive layer decreases.

The adhesive composition (B) may include an additional component as long as the advantageous effects of the invention are not impaired.

Examples of the additional component include those mentioned above in connection with the adhesive composition (A).

The content of each additional component in the adhesive composition (B) is preferably 0.01 to 5 mass %, and more preferably 0.01 to 2 mass %.

The adhesive composition (B) may be prepared by appropriately mixing and stirring the isobutylene-isoprene copolymer, the tackifier (optional), an optional additional component, and a solvent using a normal method.

Examples of the solvent include an aromatic hydrocarbon-based solvent such as benzene and toluene; an ester-based solvent such as ethyl acetate and butyl acetate; a ketone-based solvent such as acetone, methyl ethyl ketone, and methyl isobutyl ketone; an aliphatic hydrocarbon-based solvent such as n-pentane, n-hexane, and n-heptane; an alicyclic hydrocarbon-based solvent such as cyclopentane and cyclohexane; and the like.

These solvents may be used either alone or in combination.

The solid content in the resulting adhesive composition is preferably 10 to 60 mass %, more preferably 10 to 45 mass %, and still more preferably 15 to 30 mass %.

The thickness of the adhesive layer is preferably 0.5 to 200 μm, more preferably 1 to 100 μm, and still more preferably 5 to 80 μm. When the thickness of the adhesive layer is 0.5 μm or more, further improved adhesion can be easily obtained. When the thickness of the adhesive layer is 200 μm or less, it is possible to form the adhesive layer with high productivity.

The adhesive sheet (B) according to one embodiment of the invention includes at least the gas barrier film, and the adhesive layer that is formed on the gas barrier film. The adhesive sheet (B) may include two or more gas barrier films and/or two or more adhesive layers.

Figure 2:
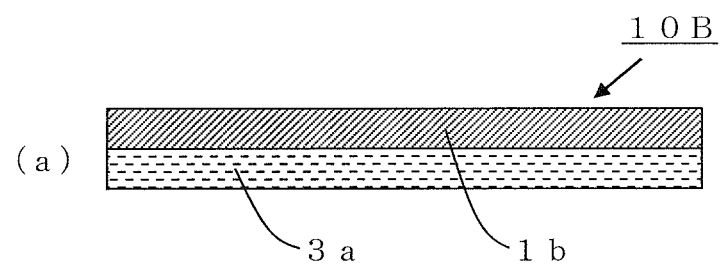
FIG. 2 is a view illustrating an example of the layer configuration of an adhesive sheet according to one embodiment of the invention.
Figure 2:
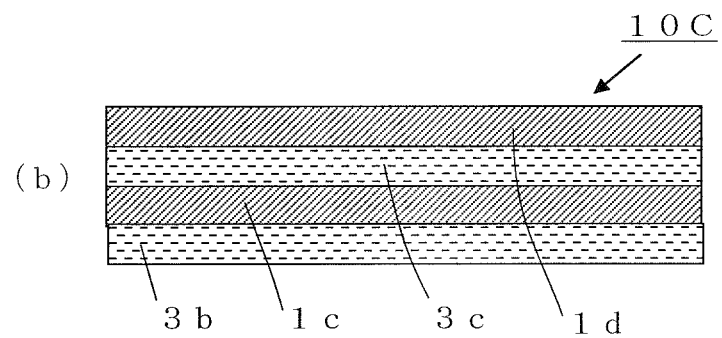
Figure 2:
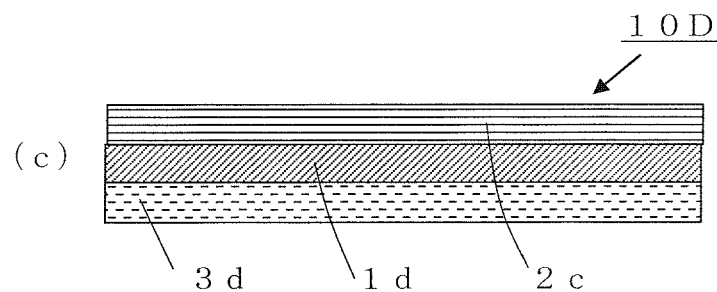

Examples of the adhesive sheet (B) include an adhesive sheet 10B (see (a) in FIG. 2) that includes a gas barrier film 3a, and an adhesive layer 1b that is formed on the gas barrier film 3a, an adhesive sheet 10C (see (b) in FIG. 2) that is obtained by stacking two adhesive sheets illustrated in (a) in FIG. 2, an adhesive sheet 10D that is obtained by stacking a release sheet 2c on the adhesive layer of the adhesive sheet illustrated in (a) in FIG. 2, and the like. Note that the adhesive sheet (B) according to one embodiment of the invention is not limited to those illustrated in FIG. 2. For example, the adhesive sheet (B) may have a configuration in which three or more adhesive sheets illustrated in (a) in FIG. 2 are stacked.

Whether or not the adhesive layer included in the adhesive sheet (B) exhibits excellent adhesion is determined by measuring the adhesion of the adhesive layer.

For example, when the adhesive sheet is bonded to a glass substrate at 23° C. and 50% RH, and the adhesion of the adhesive layer is measured after allowing the laminate to stand for 24 hours, the adhesion of the adhesive layer to the glass substrate is preferably 3 N/25 mm or more, more preferably 5 N/25 mm or more, and still more preferably 10 N/25 mm or more.

When the adhesion of the adhesive layer to a glass substrate is within the above range, the adhesive layer sufficiently adheres to a transparent substrate (e.g., glass sheet), and can effectively seal a photoelectric conversion device.

The adhesion of the adhesive layer to a polyethylene terephthalate film is preferably 0.5 N/25 mm or more, more preferably 1 N/25 mm or more, and still more preferably 5 N/25 mm or more. When the adhesion of the adhesive layer to a polyethylene terephthalate film is within the above range, the adhesive layer sufficiently adheres to the gas barrier film, and can more effectively suppress entry of water vapor from the interface between the gas barrier film and the adhesive layer.

An adhesive layer having a thickness of 60 μm that is formed using the adhesive composition (B) preferably has a water vapor transmission rate at a temperature of 40° C. and a relative humidity of 90% of 10 g/m$^2$/day or less, more preferably 8 g/m$^2$/day or less, and still more preferably 5 g/m$^2$/day or less.

The water vapor transmission rate of the adhesive layer may be measured using the method described later in connection with the examples.

When the water vapor transmission rate of the adhesive layer is within the above range, the adhesive layer can more effectively suppress entry of water vapor when used as a sealing material for a photoelectric conversion device formed on a transparent substrate.

Since the water vapor transmission rate of the adhesive layer depends on the thickness of the adhesive layer, the water vapor transmission rate of the adhesive layer is converted using the thickness of the adhesive layer when the thickness of the adhesive layer is not 60 μm. For example, when the thickness of the adhesive layer is A μm, and the water vapor transmission rate of the adhesive layer is B g/m$^2$/day, the water vapor transmission rate of the adhesive layer is converted using the expression "A×B/60".

The product of the water vapor transmission rate X (g/m$^2$/day) of the adhesive layer included in the adhesive sheet (B) at a temperature of 40° C. and a relative humidity of 90%, and the thickness Y (μm) of the adhesive layer included in the adhesive sheet (B), is preferably less than 300, more preferably 10 to 300, and still more preferably 100 to 200.

When the product of the water vapor transmission rate X and the thickness Y of the adhesive layer is less than 300, it is possible to effectively suppress entry of water vapor from the side of the adhesive layer when a photoelectric conversion device formed on a transparent substrate is sealed using the adhesive composition. If the product of the water vapor transmission rate X and the thickness Y of the adhesive layer exceeds 300, water vapor may enter in the thickness direction (side) of the adhesive layer, and a deterioration in photoelectric conversion device may occur. If the product of the water vapor transmission rate X and the thickness Y of the adhesive layer is too small, sufficient adhesion may not be obtained, and a deterioration in water vapor barrier capability may occur.

(3) Method for Producing Adhesive Sheet (B)

The adhesive sheet (B) may be produced using a known method. For example, the adhesive sheet 10B (see (a) in FIG. 2) may be produced as described below.

(i) Production Method 1

The gas barrier film 3a is provided. The adhesive composition (B) is applied to the gas barrier film 3a using a known method, and the resulting film is dried to form the adhesive layer 1b to obtain the desired adhesive sheet 10B.

After forming the adhesive layer, the release sheet 2c may be stacked on the adhesive layer in order to protect the adhesive layer of the resulting adhesive sheet to obtain the adhesive sheet 10D (see (c) in FIG. 2) provided with a release sheet.

The adhesive composition (B) may be applied using a spin coating method, a spray coating method, a bar coating method, a knife coating method, a roll coating method, a blade coating method, a die coating method, a gravure coating method, or the like.

The film is dried at 80 to 150° C. for 30 seconds to 5 minutes, for example.

The dried film may be allowed to stand for about 1 week to cure the adhesive layer.

Examples of the release sheet include those mentioned above in connection with production of the adhesive sheet 10A.

(ii) Production Method 2

The adhesive sheet (B) may also be produced as described below.

Specifically, a release sheet that has been subjected on one side to a release treatment using a release agent, is provided. The adhesive composition is applied to the release-treated surface of the release sheet using a known method in the same manner as in the production method 1, and the resulting film is dried to form an adhesive layer to obtain an adhesive sheet provided with a release sheet. The adhesive sheet provided with a release sheet is stacked on the gas barrier film to obtain the adhesive sheet 10D (see (c) in FIG. 2) provided with a release sheet.

The adhesive sheet (B) obtained as described above includes the gas barrier film that exhibits an excellent gas barrier capability and excellent transparency, and the adhesive layer that exhibits an excellent water barrier capability, excellent transparency, and excellent adhesion.

Therefore, the adhesive sheet according to one embodiment of the invention may suitably be used as a sealing material for a device formed on a transparent substrate that can prevent a situation in which oxygen, water, and the like enter a device formed on a transparent substrate, and cause an electrode and a device to deteriorate.

Since the adhesive layer included in the adhesive sheet (B) exhibits an excellent water barrier capability, excellent transparency, and excellent adhesion, the adhesive sheet according to one embodiment of the invention may preferably be used to seal an electronic device (described later).

Since the adhesive layer exhibits excellent adhesion and an excellent water barrier capability, it is possible to take full advantage of the performance of the gas barrier film, and seal a device formed on a transparent substrate.

The adhesive sheet (B) according to one embodiment of the invention is used as a sealing material for a device that can prevent a situation in which oxygen, water, and the like enter a device (e.g., organic EL device) formed on a transparent substrate, and cause an electrode and an organic layer to deteriorate.

3) Electronic Device

An electronic device according to one embodiment of the invention includes a transparent substrate, a device that is formed on the transparent substrate, and a sealing material that seals the device, the sealing material being formed of the adhesive composition (A) according to one embodiment of the invention (electronic device (A)), or includes a transparent substrate, a device that is formed on the transparent substrate, and an adhesive sheet that is stacked so as to cover the device, the adhesive sheet including a gas barrier film, and an adhesive layer that is formed on the gas barrier film, the adhesive layer being formed of a composition that includes an isobutylene-isoprene copolymer as the main component, the gas barrier film having a water vapor transmission rate at a temperature of 40° C. and a relative humidity of 90% of 0.1 g/m$^2$/day or less, and having a total light transmittance of 80% or more, and the device being sealed with the adhesive layer (electronic device (B)).

Examples of the electronic device include an organic device such as an organic transistor, an organic memory, and an organic EL device, a liquid crystal display, electronic paper, a thin film transistor, an electrochromic device, an electrochemical light-emitting device, a touch panel, a solar cell, a thermoelectric conversion device, a piezoelectric conversion device, an electrical storage device, and the like.

Examples of the device include a photoelectric conversion device such as a device that converts electrical energy into light (e.g., light-emitting diode and semiconductor laser), and a device that converts light into electrical energy (e.g., photodiode and solar cell); a light-emitting device such as an organic EL device; and the like.

The type, the size, the shape, the number, and the like of the device(s) formed on the transparent substrate are not particularly limited as long as the device can be sealed using the adhesive composition according to one embodiment of the invention.

The transparent substrate on which the device is formed is not particularly limited. Various substrate materials may be used. In particular, it is preferable to use a substrate material having high visible light transmittance. It is preferable to use a material that exhibits a high barrier capability that blocks entry of water and gas from the outside of the device, and exhibits excellent solvent resistance and excellent weatherability. Specific examples of such a material include a transparent inorganic material such as quartz and glass; a transparent plastic such as polyethylene terephthalate, polyethylene naphthalate, polycarbonate, polystyrene, polyethylene, polypropylene, polyphenylene sulfide, polyvinylidene fluoride, acetyl cellulose, phenoxy bromide, an aramid, a polyimide, a polystyrene, a polyarylate, a polysulfone, and a polyolefin; and the like.

The thickness of the transparent substrate is not particularly limited, and may be appropriately selected taking account of light transmittance and a barrier capability.

A transparent conductive layer may be provided on the transparent substrate. The sheet resistance of the transparent electrode layer is preferably 500 Ω/sq or less, and more preferably 100 Ω/sq or less.

A known material may be used as a material for forming the transparent conductive layer. Specific example of the material for forming the transparent conductive layer include indium tin oxide (ITO), fluorine-doped tin(IV) oxide ($SnO_2$) (FTO), tin(IV) oxide ($SnO_2$), zinc(II) oxide (ZnO), indium zinc oxide (IZO), and the like.

These materials may be used either alone or in combination.

Electronic Device (A)

The electronic device (A) according to one embodiment of the invention includes the transparent substrate, the device that is formed on the transparent substrate, and the sealing material that seals the device, the sealing material being formed of the adhesive composition (A) according to one embodiment of the invention.

Figure 3:
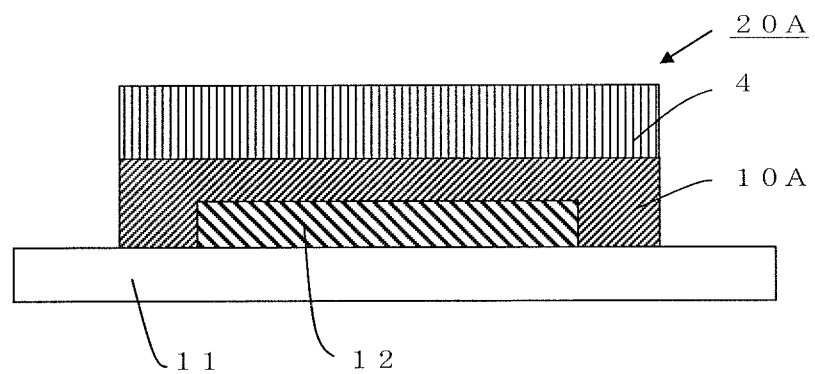
FIG. 3 is a view illustrating an example of an electronic device according to one embodiment of the invention.

FIG. 3 is a cross-sectional view illustrating the structure of an organic EL device as an example of the electronic device (A) according to one embodiment of the invention.

An organic EL device 20A includes a glass substrate 11, and a structure 12 that is formed on the glass substrate 11. The structure 12 is formed by stacking a transparent electrode, a hole-transporting layer, an emitting layer, a bottom electrode, and the like (not illustrated in FIG. 3). An adhesive layer 10A and a sealing substrate 4 are stacked (laminated) on the structure 12 and the glass substrate 11.

Since the structure 12 of the organic EL device is covered with the adhesive layer 10A, entry of water and the like is suppressed. Since the adhesive layer 10A exhibits excellent adhesion, delamination rarely occurs at the interface between the adhesive layer 10A and the sealing substrate 4, and the interface between the adhesive layer 10A and the structure 12, and entry of water and the like from the interface is suppressed.

The electronic device (A) may be produced as described below, for example. An adhesive sheet that includes a release sheet, and an adhesive layer that is formed on the release sheet (adhesive sheet (A) according to one embodiment of the invention) is provided. The adhesive layer included in the adhesive sheet (A) is formed using the adhesive composition (A) according to one embodiment of the invention. The adhesive layer of the adhesive sheet (A) is bonded to an adherend (i.e., an optical device such as an organic EL device) so as to cover the adherend. The adhesive layer that exhibits excellent adhesion to the adherend and an excellent water barrier capability, and functions as a sealing material, is thus provided on the surface of the adherend. After removing the release sheet, the sealing substrate 4 is stacked on the exposed adhesive layer. The adhesive layer that exhibits excellent adhesion to the adherend and an excellent water barrier capability, and functions as a sealing material, is thus provided on the surface of the adherend.

A known substrate such as a glass sheet or a plastic film may be used as the sealing substrate 4.

Examples of the plastic film include a film and a sheet formed of a resin (e.g., polyimide, polyamide, polyamide-imide, polyphenylene ether, polyether ketone, polyether ether ketone, polyolefin, polyester, polycarbonate, polysulfone, polyether sulfone, polyphenylene sulfide, polyarylate, acrylic-based resin, cycloolefin-based polymer, aromatic-based polymer, or polyurethane-based polymer).

The thickness of the sealing substrate 4 is not particularly limited, but is preferably 0.5 to 500 μm, more preferably 1 to 200 μm, and still more preferably 5 to 100 μm, from the viewpoint of ease of handling.

A gas barrier layer may be formed on the plastic film either directly or through an additional layer in order to provide the plastic film with a gas barrier capability. The thickness of the gas barrier layer is not particularly limited, but is normally 10 to 2000 nm, preferably 20 to 1000 nm, more preferably 30 to 500 nm, and still more preferably 40 to 200 nm, from the viewpoint of gas barrier capability and handling capability.

The gas barrier layer may include a single layer, or may include a plurality of layers. It is preferable that the gas barrier layer include a plurality of layers since a higher gas barrier capability can be obtained.

A material for forming the gas barrier layer and the like are not particularly limited as long as it is possible to provide the gas barrier layer with the desired gas barrier capability.

A protective layer, a conductive layer, a primer layer, or the like may be stacked on the sealing substrate 4. These layers may be situated (stacked) at an arbitrary position.

The water vapor transmission rate of the sealing substrate 4 at a temperature of 40° C. and a relative humidity of 90% is preferably 0.5 g/(m²·day) or less, and more preferably 0.05 g/(m²·day) or less.

Electronic Device (B)

The electronic device (B) according to one embodiment of the invention includes the transparent substrate, the device that is formed on the transparent substrate, and the adhesive sheet that is stacked so as to cover the device, the adhesive sheet including the gas barrier film, and the adhesive layer that is formed on the gas barrier film, the adhesive layer being formed of a composition that includes an isobutylene-isoprene copolymer as the main component, the gas barrier film having a water vapor transmission rate at a temperature of 40° C. and a relative humidity of 90% of 0.1 $g/m^2/day$ or less, and having a total light transmittance of 80% or more, and the device being sealed with the adhesive layer.

Figure 4:
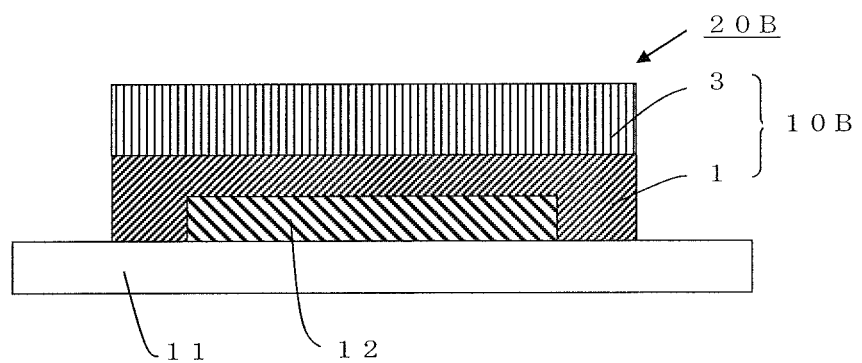
FIG. 4 is a view illustrating an example of an electronic device according to one embodiment of the invention.

FIG. 4 illustrates the structure of an organic EL device (i.e., photoelectric conversion device) as an example of the electronic device (B) according to one embodiment of the invention. An organic EL device 20B includes a glass substrate (transparent substrate) 11, and a structure 12 that is formed on the glass substrate 11. An adhesive sheet 10B that includes an adhesive layer 1 and a gas barrier film 3 is stacked (laminated) on the structure 12 and the glass substrate 11.

The organic EL device 20B illustrated in FIG. 4 may be produced as described below, for example.

The adhesive layer 1 of the adhesive sheet 10B according to one embodiment of the invention is bonded to the structure 12 and the glass substrate 11 to obtain the organic EL device 20B illustrated in FIG. 4.

Since the structure 12 of the organic EL device 20B is covered with the adhesive layer 1 of the adhesive sheet 10B according to one embodiment of the invention, entry of water and the like is suppressed. Since the adhesive sheet 10B according to one embodiment of the invention includes the gas barrier film 3 that exhibits an excellent water barrier capability and excellent transparency, and the adhesive layer 1 that exhibits an excellent water barrier capability and excellent adhesion, and is formed of the adhesive composition that includes the isobutylene-isoprene copolymer as the main component, delamination rarely occurs at the interface between the adhesive layer 1 and the gas barrier film 3, and it is possible to suppress a situation in which oxygen, water, and the like enter the device, and cause the electrode and the organic layer to deteriorate.

Since the structure 12 is sealed with the gas barrier film 3 and the adhesive layer 1 that exhibit excellent transparency, light incident on the structure 12, or light emitted from the structure 12, is not blocked, and the performance of the structure 12 can be maintained at a high level.

EXAMPLES

The invention is further described below by way of examples. Note that the invention is not limited to the following examples.

Note that the units "parts" and "%" used in connection with the examples respectively refer to "parts by mass" and "mass %" unless otherwise indicated.
Compound The following compounds and materials were used in the examples. Isobutylene-isoprene copolymer (1): "Exxon Butyl 268" manufactured by Japan Butyl Co., Ltd., number average molecular weight: 260,000, isoprene content: 1.7 mol % Isobutylene-isoprene copolymer (2): "Exxon Butyl 288" manufactured by Japan Butyl Co., Ltd., number average molecular weight: 260,000, isoprene content: 2.3 mol % Polyisobutylene-based resin (1): "Oppanol B30" manufactured by BASF, number average molecular weight: 200,000, isoprene content: 0 mol % Polyisobutylene-based resin (2): "Oppanol B50" manufactured by BASF, number average molecular weight: 340,000, isoprene content: 0 mol %

Note that the number average molecular weight of the isobutylene-isoprene copolymer was determined as a standard polystyrene-reduced value (standard polystyrene-equivalent value) by performing gel permeation chromatography under the following conditions.
Device: "HLC-8020" manufactured by Tosoh Corporation
Column: TSK guard column HXL-H, TSK gel GMHXL (×2), and TSK gel G2000HXL (manufactured by Tosoh Corporation)
Column temperature: 40° C.
Eluant: tetrahydrofuran
Flow rate: 1.0 mL/min
Tackifier (1): aliphatic petroleum resin ("Quintone A100" manufactured by Zeon Corporation, softening point: 100° C.)
Tackifier (2): aliphatic petroleum resin ("Quintone B170" manufactured by Zeon Corporation, softening point: 70° C.)
Tackifier (3): aliphatic petroleum resin ("Quintone R100" manufactured by Zeon Corporation, softening point: 96° C.)

The softening point of the tackifiers (1) to (3) was measured in accordance with JIS K 2531.
Release sheet (1): polyethylene terephthalate film subjected to a silicone release treatment ("SP-PET381130" manufactured by Lintec Corporation, thickness: 38 μm)
Release sheet (2): polyethylene terephthalate film subjected to a silicone release treatment ("SP-PET38T103-1" manufactured by Lintec Corporation, thickness: 38 μm)

Example 1

Preparation of Adhesive Composition 100 parts of the isobutylene-isoprene copolymer (1) was dissolved in toluene to prepare an adhesive composition having a solid content of 20%.
Production of Adhesive Sheet The adhesive composition was applied to the release-treated surface of the release sheet (2) so that the thickness after drying was 60 μm, and the resulting film was dried at 120° C. for 2 minutes to form an adhesive layer. The release-treated surface of the release sheet (1) was bonded to the adhesive layer to obtain an adhesive sheet.

Examples 2 to 18 and Comparative Examples 1 to 5

An adhesive composition was prepared in the same manner as in Example 1, except that each component and the amount of each component were changed as shown in Table 1, and an adhesive sheet was produced in the same manner as in Example 1, except that the resulting adhesive composition was used.

Comparative Example 5

A reactor was charged with 90 parts of butyl acrylate, 10 parts of acrylic acid, and 0.2 parts of azobisisobutyronitrile (initiator), which were mixed. The resulting mixture was deaerated by bubbling nitrogen gas for 4 hours, and heated to 60° C. with stirring. The mixture was stirred at 60° C. for 24 hours to effect a polymerization reaction. The reaction mixture was diluted with ethyl acetate to obtain an ethyl acetate solution of an acrylic-based copolymer (weight average molecular weight: 650,000) (solid content: 33%).

After the addition of an ethyl acetate solution of trimethylolpropane-modified tolylene diisocyanate ("Coronate L" manufactured by Nippon Polyurethane Industry Co., Ltd., solid content: 75 mass %) (crosslinking agent) so that the amount of solid was 1.5 parts based on 100 parts of the solid included in the ethyl acetate solution, toluene was added to the mixture to obtain an adhesive composition including an acrylic-based copolymer as the main component (solid content: 20%).

An adhesive sheet was produced in the same manner as in Example 1, except that the resulting adhesive composition was used.

Table 1 shows the composition of the adhesive layers of the adhesive sheets obtained in the examples and the comparative examples.

(manufactured by Asia Alumi Co., Ltd.) (sealing substrate) to obtain a sealing substrate provided with an adhesive layer. The sealing substrate provided with an adhesive layer was dried by heating at 120° C. for 10 minutes in a nitrogen atmosphere using a hot plate, and allowed to cool to room temperature. After removing the release sheet (2) from the sealing substrate provided with an adhesive layer, the

TABLE 1

| | Adhesive layer | | | | | | |
|---|---|---|---|---|---|---|---|
| | Isobutylene-isoprene copolymer (parts by mass) | | Polyisobutylene | | | | |
| | Isobutylene-isoprene copolymer (1) | Isobutylene-isoprene copolymer (2) | Polyisobutylene (1) | Polyisobutylene (2) | Tackifier (1) | (2) | (3) |
| Example 1 | 100 | — | — | — | — | — | — |
| Example 2 | 100 | — | — | — | 10 | — | — |
| Example 3 | 100 | — | — | — | 20 | — | — |
| Example 4 | 100 | — | — | — | 30 | — | — |
| Example 5 | 100 | — | — | — | 40 | — | — |
| Example 6 | 100 | — | — | — | 50 | — | — |
| Example 7 | 100 | — | — | — | — | 10 | — |
| Example 8 | 100 | — | — | — | — | 20 | — |
| Example 9 | 100 | — | — | — | — | 30 | — |
| Example 10 | 100 | — | — | — | — | 40 | — |
| Example 11 | 100 | — | — | — | — | 50 | — |
| Example 12 | 100 | — | — | — | — | — | 10 |
| Example 13 | 100 | — | — | — | — | — | 20 |
| Example 14 | 100 | — | — | — | — | — | 30 |
| Example 15 | 100 | — | — | — | — | — | 40 |
| Example 16 | 100 | — | — | — | — | — | 50 |
| Example 17 | — | 100 | — | — | 20 | — | — |
| Example 18 | — | 100 | — | — | 50 | — | — |
| Comparative Example 1 | — | — | 100 | — | — | — | — |
| Comparative Example 2 | — | — | 100 | — | 20 | — | — |
| Comparative Example 3 | — | — | — | 100 | — | — | — |
| Comparative Example 4 | — | — | — | 100 | 20 | — | — |

Production of Organic EL Device

An indium tin oxide (ITO) film (thickness: 150 nm, sheet resistance: 30 Ω/sq) was formed on the surface of a glass substrate using a sputtering method, and subjected to a solvent washing treatment and a UV/ozone treatment to form an anode.

N,N'-Bis(naphthalen-1-yl)-N,N'-bis(phenyl)-benzidine) (manufactured by Luminescence Technology) (60 nm), tris (8-hydroxyquinolinato)aluminum (manufactured by Luminescence Technology) (40 nm), 2,9-dimethyl-4,7-diphenyl-1,10-phenanthroline (manufactured by Luminescence Technology) (10 nm), and (8-hydroxyquinolinolato)lithium (manufactured by Luminescence Technology) (10 nm) were sequentially deposited on the anode (ITO film) at a deposition rate of 0.1 to 0.2 nm/s to form an emitting layer.

Aluminum (Al) (manufactured by Kojundo Chemical Lab. Co., Ltd.) (100 nm) was deposited on the emitting layer at a deposition rate of 0.1 nm/s to form a cathode.

Note that the degree of vacuum during deposition was set to $1 \times 10^{-4}$ Pa or less.

After removing the release sheet (1) from the adhesive sheet obtained in Example 1, the exposed adhesive layer was bonded to a laminate film obtained by bonding a polyethylene terephthalate sheet (12 μm) to each side of an aluminum foil (7 μm) using a urethane-based adhesive layer exposed adhesive layer was laminated on the cathode so as to cover the entirety of the cathode to obtain an organic EL device.

Organic EL devices were produced in the same manner as in Example 1, except that the adhesive sheets obtained in Examples 2 to 18 and Comparative Examples 1 to 5 were respectively used.

The organic EL devices obtained as described above were subjected to the following measurements, and evaluated as described below. The measurement results and the evaluation results are shown in Table 2.

Measurement of Water Vapor Transmission Rate

After removing the release sheets (1) and (2) from the adhesive sheet, the adhesive sheet was bonded to a polyethylene terephthalate film (manufactured by Mitsubishi Plastics Inc., thickness: 6 μm) to obtain a water vapor transmission rate measurement sample in which the adhesive layer was situated between two polyethylene terephthalate films. The water vapor transmission rate of the adhesive layer was measured at 40° C. and 90% RH using a water vapor transmission rate measurement apparatus ("L80-5000" manufactured by LYSSY).

Measurement of Adhesion

The adhesive composition (adhesive compositions used in Examples 1 to 18 and Comparative Examples 1 to 5) was applied to the release-treated surface of the release sheet (2) so that the thickness after drying was 20 μm, and the resulting film was dried at 120° C. for 2 minutes to form an adhesive layer. A laminate film obtained by bonding a polyethylene terephthalate sheet (12 μm) to each side of an aluminum foil (7 μm) using a urethane-based adhesive layer (manufactured by Asia Alumi Co., Ltd.) was bonded to the adhesive layer to obtain an adhesion measurement sample.

The sample was cut to dimensions of 25×300 mm. After removing the release sheet (2), the exposed adhesive layer was bonded to an adherend (see below) at 23° C. and 50% RH, and the adhesive sheet and the adherend were compression-bonded by reciprocating a roller having a weight of 2 kg by one stroke to obtain a specimen.

After allowing the specimen to stand at 23° C. and 50% RH for 24 hours, the specimen was subjected to a peel test at 23° C. and 50% RH using a tensile tester ("Tensilon" manufactured by Orientec Co., Ltd.) at a peel rate of 300 mm/min and a peel angle of 180° to measure the adhesion (N/25 mm) of the specimen.

The following adherends were used for the measurement of adhesion. PET film: Cosmoshine A4100 manufactured by Toyobo Co., Ltd., thickness: 50 μm Glass sheet (soda-lime glass): product manufactured by Nippon Sheet Glass Co., Ltd.

Water Entry Test

After removing the release sheet (1) from the adhesive sheet, the adhesive layer was bonded to a laminate film obtained by bonding a polyethylene terephthalate sheet (12 μm) to each side of an aluminum foil (7 μm) using a urethane-based adhesive layer (manufactured by Asia Alumi Co., Ltd.) to obtain a water entry test sample.

After removing the release sheet (2) from the water entry test sample, the exposed adhesive layer was bonded to the calcium layer formed on the glass substrate in a nitrogen atmosphere using a laminator to obtain a water entry test specimen in which the calcium layer was sealed.

The resulting specimen was allowed to stand at 60° C. and 90% RH for 170 hours, and the degree of discoloration of the calcium layer (i.e., the degree of entry of water) was observed with the naked eye. The water barrier capability was evaluated in accordance with the following standard.

Evaluation Standard

A: Less than 20% (area ratio) of the calcium layer was discolored.

B: 20% or more and less than 40% (area ratio) of the calcium layer was discolored.

C: 40% or more (area ratio) of the calcium layer was discolored.

Evaluation of Organic EL Device (Organic Device)

The organic EL device produced as described above was allowed to stand at 23° C. and 50% RH for 200 hours, and driven to observe the presence or absence of a dark spot (i.e., an area in which light was not emitted). The organic EL device was evaluated in accordance with the following standard.

Good: The ratio of a dark spot area was less than 5% with respect to the emission area.

Fair: The ratio of a dark spot area was 5% or more and less than 10% with respect to the emission area.

Poor: The ratio of a dark spot area was 10% or more with respect to the emission area.

TABLE 2

| | Water vapor transmission rate (g/m²/day) | Thickness (μm) | Water vapor transmission rate × thickness | Adhesion PET N/25 mm | Adhesion Glass N/25 mm | Water entry test |
|---|---|---|---|---|---|---|
| Example 1 | 2.8 | 60 | 168 | 0.6 | 3.2 | A |
| Example 2 | 2.6 | 60 | 156 | 4.2 | 10.3 | A |
| Example 3 | 2.7 | 60 | 162 | 7.2 | 13.8 | A |
| Example 4 | 2.8 | 60 | 168 | 10.4 | 15 | A |
| Example 5 | 2.8 | 60 | 168 | 11.2 | 16.8 | A |
| Example 6 | 2.8 | 60 | 168 | 11.2 | 18.4 | A |
| Example 7 | 2.8 | 60 | 168 | 2.9 | 6.32 | A |
| Example 8 | 2.8 | 60 | 168 | 7.86 | 8.42 | A |
| Example 9 | 2.8 | 60 | 168 | 8.2 | 11.6 | A |
| Example 10 | 2.8 | 60 | 168 | 11.4 | 13.4 | A |
| Example 11 | 2.8 | 60 | 168 | 14.6 | 18.4 | A |
| Example 12 | 2.7 | 60 | 162 | 3.2 | 9.2 | A |
| Example 13 | 2.7 | 60 | 162 | 7.2 | 12.2 | A |
| Example 14 | 2.8 | 60 | 168 | 12.2 | 15.2 | A |
| Example 15 | 2.8 | 60 | 168 | 15.2 | 18.2 | A |
| Example 16 | 2.9 | 60 | 174 | 16.2 | 19.8 | A |
| Example 17 | 3.1 | 60 | 186 | 6.9 | 12.4 | A |
| Example 18 | 3 | 60 | 180 | 10.8 | 17.6 | A |
| Comparative Example 1 | 6 | 60 | 360 | 0.6 | 2.3 | B |
| Comparative Example 2 | 6 | 60 | 360 | 6.3 | 11.4 | B |
| Comparative Example 3 | 6 | 60 | 360 | 0.3 | 1.2 | B |
| Comparative Example 4 | 6 | 60 | 360 | 4.8 | 8.5 | B |
| Comparative Example 5 | 98 | 60 | 5880 | 11.6 | 10.2 | C |

A calcium layer having a length of 32 mm, a width of 40 mm, and a thickness of 100 nm was formed on an alkali-free glass substrate (manufactured by Corning, 45×45 mm) using a vacuum deposition method.

The following were confirmed from the results shown in Table 2.

The adhesive layers that were respectively formed using the adhesive compositions of Examples 1 to 18 had a low water vapor transmission rate, and exhibited an excellent water barrier capability and excellent adhesion. The organic EL devices that were sealed with the sealing materials that were respectively formed using the adhesive compositions of Examples 1 to 18 showed high performance when subjected to the water entry test, and exhibited high durability. On the other hand, the adhesive layers that were formed using the adhesive compositions of Comparative Examples 1 to 4 including a polyisobutylene-based resin (that did not include isoprene) as the main component showed insufficient performance when subjected to the water entry test, and the organic EL devices exhibited low durability. The adhesive layer of Comparative Example 5 that was formed using the adhesive composition including an acrylic-based copolymer as the main component had a high water vapor transmission rate, and showed low performance when subjected to the water entry test, and the organic EL device exhibited low durability.

Production of Gas Barrier Film (A)

A polysilazane compound ("Aquamika NL110-20" manufactured by Clariant Japan K.K. (i.e., a coating material including perhydropolysilazane as the main component)) was spin-coated onto a polyethylene terephthalate film ("Cosmoshine A4100" manufactured by Toyobo Co., Ltd., thickness: 50 μm, hereinafter referred to as "PET film") (base), and heated at 120° C. for 1 minute to form a polysilazane layer including perhydropolysilazane (thickness: 150 nm). Argon (Ar) ions were implanted into the surface of the polysilazane layer under the following conditions using a plasma ion implantation apparatus to form a gas barrier layer to obtain a gas barrier film (A).

The details of the plasma ion implantation apparatus and the ion implantation conditions used to form the gas barrier layer are shown below.
Plasma ion implantation apparatus
RF power supply: "RF56000" manufactured by JEOL Ltd.
High-voltage pulse power supply: "PV-3-HSHV-0835" manufactured by Kurita Seisakusho Co., Ltd.
Plasma ion implantation conditions
Plasma-generating gas: Ar
Gas flow rate: 100 sccm
Duty ratio: 0.5%
Applied voltage: −15 kV
RF power supply: frequency: 13.56 MHz, applied electric power: 1000 W
Chamber internal pressure: 0.2 Pa
Pulse width: 5 μsec
Treatment time (ion implantation time): 200 sec Production of Gas Barrier Film (B)

A polysilazane compound ("Aquamika NL110-20" manufactured by Clariant Japan K.K. (i.e., a coating material including perhydropolysilazane as the main component)) was spin-coated onto a polyethylene terephthalate film ("Cosmoshine A4100" manufactured by Toyobo Co., Ltd., thickness: 50 μm, hereinafter referred to as "PET film") (base), and heated at 120° C. for 1 minute to form a polysilazane layer including perhydropolysilazane (thickness: 150 nm). Argon (Ar) ions were implanted into the surface of the polysilazane layer under the following conditions using a plasma ion implantation apparatus to form a gas barrier layer to obtain a gas barrier film (B).

The details of the plasma ion implantation apparatus and the ion implantation conditions used to form the gas barrier layer are shown below.
Plasma ion implantation system
RF power supply: "RF56000" manufactured by JEOL Ltd.
High-voltage pulse power supply: "PV-3-HSHV-0835" manufactured by Kurita Seisakusho Co., Ltd.
Plasma ion implantation conditions
Plasma-generating gas: Ar
Gas flow rate: 100 sccm
Duty ratio: 0.5%
Applied voltage: −6 kV
RF power supply: frequency: 13.56 MHz, applied electric power: 1000 W
Chamber internal pressure: 0.2 Pa
Pulse width: 5 μsec
Treatment time (ion implantation time): 200 sec Production of Gas Barrier Film (C)

A gas barrier layer (silicon oxide layer, thickness: 100 nm) was formed on a polyethylene terephthalate film ("PET38T-100" manufactured by Mitsubishi Plastics Inc., thickness: 38 μm, hereinafter referred to as "PET film") (base) using a sputtering method to obtain a gas barrier film (C).

Production of Gas Barrier Film (D)

A gas barrier layer (silicon nitride layer, thickness: 100 nm) was formed on a polyethylene terephthalate film ("PET38T-100" manufactured by Mitsubishi Plastics Inc., thickness: 38 μm, hereinafter referred to as "PET film") (base) using a sputtering method to obtain a gas barrier film (D).

Example 19

Preparation of Adhesive Composition 100 parts of the isobutylene-isoprene copolymer (1) was dissolved in toluene to prepare an adhesive composition 1 having a solid content of 20%.

Production of Adhesive Sheet

The adhesive composition 1 was applied to the gas barrier layer of the gas barrier film (A) so that the thickness after drying was 20 μm, and the resulting film was dried at 110° C. for 1 minute to form an adhesive layer. The release-treated surface of a polyethylene terephthalate film subjected to a silicone release treatment ("SP-PET381130" manufactured by Lintec Corporation, thickness: 38 μm) (release sheet) was bonded to the adhesive layer to obtain an adhesive sheet.

Examples 20 to 38 and Comparative Examples 6, 7, and 9

Adhesive compositions 2 to 24 were obtained in the same manner as in Example 19, except that the composition was changed as shown in Table 3. Adhesive sheets were produced in the same manner as in Example 19, except that the resulting adhesive composition, and the gas barrier film shown in Table 4 were used.

Comparative Example 8

A reactor was charged with 90 parts of butyl acrylate, 10 parts of acrylic acid, and 0.2 parts of azobisisobutyronitrile (initiator), which were mixed. The resulting mixture was deaerated by bubbling nitrogen gas for 4 hours, and heated to 60° C. with stirring. The mixture was stirred at 60° C. for 24 hours to effect a polymerization reaction. The reaction mixture was diluted with ethyl acetate to obtain an ethyl acetate solution of an acrylic-based copolymer (weight average molecular weight: 650,000) (solid content: 33%).

After the addition of an ethyl acetate solution of trimethylolpropane-modified tolylene diisocyanate ("Coronate L" manufactured by Nippon Polyurethane Industry Co., Ltd., solid content: 75 mass %) (crosslinking agent) so that the amount of solid was 1.5 parts based on 100 parts of the solid included in the ethyl acetate solution, toluene was added to the mixture to obtain an adhesive composition including an acrylic-based copolymer as the main component (solid content: 20%).

An adhesive sheet was produced in the same manner as in Example 19, except that the resulting adhesive composition was used.

Table 3 shows the composition of the adhesive layers of the adhesive sheets obtained in the examples and the comparative examples.

The adhesive sheet (obtained in the examples and the comparative examples) was dried by heating at 120° C. for 30 minutes in a nitrogen atmosphere using a hot plate, and allowed to cool to room temperature. After removing the release sheet from the adhesive sheet, the exposed adhesive layer was laminated on the cathode so as to cover the entirety of the cathode to obtain an organic EL device.

The organic EL devices obtained as described above were subjected to the following measurements, and evaluated as described below. The measurement results and the evaluation results are shown in Table 4.

Measurement of Water Vapor Transmission Rate

The water vapor transmission rate of the gas barrier films (A) to (C) was measured at 40° C. and 90% RH using a

TABLE 3

| | Adhesive composition | Isobutylene-isoprene copolymer (parts by mass) | | Polyisobutylene-based resin (parts by mass) | Tackifier | | |
|---|---|---|---|---|---|---|---|
| | | Isobutylene-isoprene copolymer (1) | Isobutylene-isoprene copolymer (2) | (1) | (1) | (2) | (3) |
| Example 19 | 1 | 100 | — | — | — | — | — |
| Example 20 | 2 | 100 | — | — | 10 | — | — |
| Example 21 | 3 | 100 | — | — | 20 | — | — |
| Example 22 | 4 | 100 | — | — | 30 | — | — |
| Example 23 | 5 | 100 | — | — | 40 | — | — |
| Example 24 | 6 | 100 | — | — | 50 | — | — |
| Example 25 | 7 | 100 | — | — | — | 10 | — |
| Example 26 | 8 | 100 | — | — | — | 20 | — |
| Example 27 | 9 | 100 | — | — | — | 30 | — |
| Example 28 | 10 | 100 | — | — | — | 40 | — |
| Example 29 | 11 | 100 | — | — | — | 50 | — |
| Example 30 | 12 | 100 | — | — | — | — | 10 |
| Example 31 | 13 | 100 | — | — | — | — | 20 |
| Example 32 | 14 | 100 | — | — | — | — | 30 |
| Example 33 | 15 | 100 | — | — | — | — | 40 |
| Example 34 | 16 | 100 | — | — | — | — | 50 |
| Example 35 | 17 | 100 | — | — | 20 | — | — |
| Example 36 | 18 | 100 | — | — | 20 | — | — |
| Example 37 | 19 | 100 | — | — | 20 | — | — |
| Example 38 | 20 | — | 100 | — | 20 | — | — |
| Comparative Example 6 | 21 | 100 | — | — | 20 | — | — |
| Comparative Example 7 | 22 | — | — | 100 | 20 | — | — |
| Comparative Example 8 | 23 | Acrylic-based adhesive composition | | | | | |
| Comparative Example 9 | 24 | 100 | — | — | 20 | — | — |

Production of Organic EL Device

A glass substrate was subjected to a solvent washing treatment and a UV/ozone treatment, and aluminum (Al) (manufactured by Kojundo Chemical Lab. Co., Ltd.) (100 nm) was deposited on the glass substrate at a deposition rate of 0.1 nm/s to form a cathode. (8-Hydroxyquinolinato) lithium (manufactured by Luminescence Technology) (10 nm), 2,9-dimethyl-4,7-diphenyl-1,10-phenanthroline (manufactured by Luminescence Technology) (10 nm), tris(8-hydroxyquinolinato)aluminum (manufactured by Luminescence Technology) (40 nm), and N,N'-bis(naphthalen-1-yl)-N,N'-bis(phenyl)-benzidine) (manufactured by Luminescence Technology) (60 nm) were sequentially deposited on the cathode (Al film) at a deposition rate of 0.1 to 0.2 nm/s to form an emitting layer. An indium tin oxide (ITO) film (thickness: 100 nm, sheet resistance: 50 Ω/sq) was formed on the emitting layer using a sputtering method to form an anode.

Note that the degree of vacuum during deposition was set to $1\times10^{-4}$ Pa or less.

water vapor transmission rate measurement apparatus ("AQUATRON" manufactured by MOCON).

The adhesive composition (used in the examples and the comparative examples) was applied to the release-treated surface of a release sheet (polyethylene terephthalate film subjected to a silicone release treatment, "SP-PET38T103-1" manufactured by Lintec Corporation, thickness: 38 μm) so that the thickness after drying was 60 μm, and the resulting film was dried at 120° C. for 2 minutes to form an adhesive layer. A polyethylene terephthalate film (manufactured by Mitsubishi Plastics Inc., thickness: 6 μm) was bonded to the adhesive layer. After removing the release sheet, a polyethylene terephthalate film (manufactured by Mitsubishi Plastics Inc., thickness: 6 μm) was bonded to the exposed adhesive layer to obtain a water vapor transmission rate measurement sample in which the adhesive layer was situated between two polyethylene terephthalate films.

The water vapor transmission rate of the sample was measured at 40° C. and 90% RH using a water vapor transmission rate measurement apparatus ("L80-5000" manufactured by LYSSY), and taken as the water vapor transmission rate of the adhesive layer.

Measurement of Adhesion

A sample (obtained in the examples and the comparative examples) was cut to dimensions of 25×300 mm. After removing the release sheet, the exposed adhesive layer was bonded to an adherend (see below) at 23° C. and 50% RH, and the adhesive sheet and the adherend were compression-bonded by reciprocating a roller having a weight of 2 kg by one stroke to obtain a specimen.

After allowing the specimen to stand at 23° C. and 50% RH for 24 hours, the specimen was subjected to a peel test at 23° C. and 50% RH using a tensile tester ("Tensilon" manufactured by Orientec Co., Ltd.) at a peel rate of 300 mm/min and a peel angle of 180° to measure the adhesion (N/25 mm) of the specimen.

The following adherends were used for the measurement of adhesion. PET film: "Cosmoshine A4100" manufactured by Toyobo Co., Ltd., thickness: 50 μm Glass sheet (soda-lime glass): product manufactured by Nippon Sheet Glass Co., Ltd.

Water Entry Test

A calcium layer having a length of 32 mm, a width of 40 mm, and a thickness of 100 nm was formed on an alkali-free glass substrate (manufactured by Corning, 45×45 mm) using a vacuum deposition method.

After removing the release sheet from the adhesive sheet, the exposed adhesive layer was bonded to the calcium layer formed on the glass substrate in a nitrogen atmosphere using a laminator to obtain a water entry test specimen in which the calcium layer was sealed.

The resulting specimen was allowed to stand at 60° C. and 90% RH for 170 hours, and the degree of discoloration of the calcium layer (i.e., the degree of entry of water) was observed with the naked eye. The water barrier capability was evaluated in accordance with the following standard.

Evaluation Standard

A: Less than 20% (area ratio) of the calcium layer was discolored.
B: 20% or more and less than 40% (area ratio) of the calcium layer was discolored.
C: 40% or more (area ratio) of the calcium layer was discolored.

Evaluation of Organic EL Device

The organic EL device was allowed to stand at 23° C. and 50% RH for 200 hours, and driven to observe the presence or absence of a dark spot (i.e., an area in which light was not emitted). The organic EL device was evaluated in accordance with the following standard.

A: The ratio of a dark spot area was less than 5% with respect to the emission area.
B: The ratio of a dark spot area was 5% or more and less than 10% with respect to the emission area.
C: The ratio of a dark spot area was 10% or more and less than 90% with respect to the emission area.
D: The ratio of a dark spot area was 90% or more with respect to the emission area.

Luminance Decrease Ratio

The luminance of the organic EL device before and after sealing was measured at an applied voltage of 5 V. The ratio of the luminance of the organic EL device after sealing to the luminance of the organic EL device before sealing (=100%) was calculated using the following expression.

(Luminance after sealing)/(luminance before sealing)×100

Measurement of Total Light Transmittance

The total light transmittance of the gas barrier films used in the examples and the comparative examples, and the adhesive sheets obtained in the examples and the comparative examples, was measured in accordance with JIS K 7631-1 using a haze meter ("HAZE METER NDH5000" manufactured by Nippon Denshoku Industries Co., Ltd.). Note that the total light transmittance of the adhesive sheet was measured in a state in which the release sheet was removed.

TABLE 4

|  | Gas barrier film | | | Adhesive layer | | |
| --- | --- | --- | --- | --- | --- | --- |
|  | Type | Water vapor transmission rate g/m²/day | Total light transmittance % | Water vapor transmission rate g/m²/day | Adhesive sheet Total light transmittance % | Water vapor transmission rate × thickness |
| Example 19 | A | 0.0005 | 88.1 | 2.8 | 87.6 | 168 |
| Example 20 | A | 0.0005 | 88.1 | 2.6 | 87.6 | 156 |
| Example 21 | A | 0.0005 | 88.1 | 2.7 | 87.6 | 162 |
| Example 22 | A | 0.0005 | 88.1 | 2.8 | 87.6 | 168 |
| Example 23 | A | 0.0005 | 88.1 | 2.8 | 87.6 | 168 |
| Example 24 | A | 0.0005 | 88.1 | 2.8 | 87.6 | 168 |
| Example 25 | A | 0.0005 | 88.1 | 2.8 | 87.6 | 168 |
| Example 26 | A | 0.0005 | 88.1 | 2.8 | 87.6 | 168 |
| Example 27 | A | 0.0005 | 88.1 | 2.8 | 87.6 | 168 |
| Example 28 | A | 0.0005 | 88.1 | 2.8 | 87.6 | 168 |
| Example 29 | A | 0.0005 | 88.1 | 2.8 | 87.6 | 168 |
| Example 30 | A | 0.0005 | 88.1 | 2.7 | 87.6 | 162 |
| Example 31 | A | 0.0005 | 88.1 | 2.7 | 87.6 | 162 |
| Example 32 | A | 0.0005 | 88.1 | 2.8 | 87.6 | 168 |
| Example 33 | A | 0.0005 | 88.1 | 2.8 | 87.6 | 168 |
| Example 34 | A | 0.0005 | 88.1 | 2.9 | 87.6 | 174 |
| Example 35 | B | 0.01 | 90.5 | 2.8 | 90 | 168 |
| Example 36 | B | 0.01 | 90 | 2.7 | 89.5 | 162 |
| Example 37 | B | 0.01 | 90.2 | 2.7 | 89.7 | 162 |
| Example 38 | A | 0.0005 | 88.2 | 2.8 | 87.7 | 168 |
| Comparative Example 6 | C | 0.2 | 90.2 | 2.8 | 89.7 | 168 |
| Comparative Example 7 | A | 0.0005 | 88.1 | 6 | 87.6 | 360 |

TABLE 4-continued

| | | | | | | |
|---|---|---|---|---|---|---|
| Comparative Example 8 | A | 0.0005 | 88.2 | 98 | 87.7 | 5880 |
| Comparative Example 9 | D | 0.007 | 76.3 | 2.8 | 75.8 | 168 |

| | Adhesion | | | Ratio of luminance after sealing to | | |
|---|---|---|---|---|---|---|
| | PET N/25 mm | Glass | Water entry test | Evaluation of organic device | luminance before sealing % | Adhesive composition |
| Example 19 | 0.6 | 3.2 | A | Good | 94.7 | 1 |
| Example 20 | 4.2 | 10.3 | A | Good | 94.9 | 2 |
| Example 21 | 7.2 | 13.8 | A | Good | 94.8 | 3 |
| Example 22 | 10.4 | 15 | A | Good | 94.7 | 4 |
| Example 23 | 11.2 | 16.8 | A | Good | 94.8 | 5 |
| Example 24 | 11.2 | 18.4 | A | Good | 94.9 | 6 |
| Example 25 | 2.9 | 6.32 | A | Good | 95.0 | 7 |
| Example 26 | 7.9 | 8.4 | A | Good | 94.7 | 8 |
| Example 27 | 8.2 | 11.6 | A | Good | 94.9 | 9 |
| Example 28 | 11.4 | 13.4 | A | Good | 94.7 | 10 |
| Example 29 | 14.6 | 18.4 | A | Good | 94.9 | 11 |
| Example 30 | 3.2 | 9.2 | A | Good | 94.8 | 12 |
| Example 31 | 7.2 | 12.2 | A | Good | 94.9 | 13 |
| Example 32 | 12.2 | 15.2 | A | Good | 94.9 | 14 |
| Example 33 | 15.2 | 18.2 | A | Good | 95.0 | 15 |
| Example 34 | 16.2 | 19.8 | A | Good | 94.8 | 16 |
| Example 35 | 7.2 | 13.9 | A | Good | 96.8 | 17 |
| Example 36 | 7.1 | 13.8 | A | Good | 96.9 | 18 |
| Example 37 | 7.3 | 13.9 | A | Good | 96.9 | 19 |
| Example 38 | 6.5 | 10.2 | A | Good | 94.9 | 20 |
| Comparative Example 6 | 7.2 | 13.5 | B | Fair | 96.8 | 21 |
| Comparative Example 7 | 6.8 | 12.5 | B | Fair | 94.9 | 22 |
| Comparative Example 8 | 11.6 | 10.2 | C | Poor | 94.9 | 23 |
| Comparative Example 9 | 7.2 | 13.3 | A | Good | 86.2 | 24 |

The following were confirmed from the results shown in Table 4.

The adhesive sheets of Examples 19 to 38 showed high performance when subjected to the water entry test, and the organic EL devices including the adhesive sheets of Examples 19 to 38 exhibited high durability. It was possible to obtain an excellent organic EL device that showed a small decrease in luminance due to sealing although it was sealed using the gas barrier film, and showed a small change in emission color.

On the other hand, the adhesive layer of the adhesive sheet of Comparative Example 8 that was formed using an acrylic-based adhesive had a high water vapor transmission rate and a poor water barrier capability, and the organic EL device exhibited poor durability.

The adhesive layer of the adhesive sheet of Comparative Example 6 had a low water vapor transmission rate, but the gas barrier film of the adhesive sheet of Comparative Example 6 had a high water vapor transmission rate. As a result, it was impossible to take full advantage of the performance of the adhesive layer, and the organic EL device exhibited poor durability.

The gas barrier film of the adhesive sheet of Comparative Example 7 had a low water vapor transmission rate, but the adhesive layer of the adhesive sheet of Comparative Example 7 had a high water vapor transmission rate. As a result, it was impossible to take full advantage of the performance of the gas barrier film, and the organic EL device exhibited poor durability.

Since the gas barrier film of the adhesive sheet of Comparative Example 9 had a low water vapor transmission rate, but had a low total light transmittance, light emitted from the organic EL device was blocked, and the luminance after sealing significantly decreased as compared with the luminance before sealing.

REFERENCE SIGNS LIST

10, 10A, 10B, 10C, 10D: Adhesive sheet
1, 1a, 1b, 1c, 1d: Adhesive layer
2a, 2b, 2c: Release sheet
3, 3a, 3b, 3c, 3d: Gas barrier layer (gas barrier film)
4: Sealing substrate
11: Glass substrate
12: Structure
20A, 20B: Organic EL device

The invention claimed is:

1. An adhesive composition for sealing an electronic device,
    the adhesive composition consisting of an isobutylene-isoprene copolymer, a tackifier, and a solvent,
    wherein the isobutylene-isoprene copolymer has a content of repeating units derived from isoprene of 0.1 to 99 mol % based on total repeating units,
    wherein the content of the tackifier is 5 to 100 parts by mass based on 100 parts by mass of the isobutylene-isoprene copolymer, and
    wherein the solvent is at least one of benzene, toluene, ethyl acetate, butyl acetate, acetone, methyl ethyl ketone, methyl isobutyl ketone, n-pentane, n-hexane, n-heptane, cyclopentane or cyclohexane.

* * * * *